(12) United States Patent
Welsh et al.

(10) Patent No.: US 11,032,910 B2
(45) Date of Patent: Jun. 8, 2021

(54) SYSTEM-IN-PACKAGE DEVICE BALL MAP AND LAYOUT OPTIMIZATION

(71) Applicant: Octavo Systems LLC, Sugar Land, TX (US)

(72) Inventors: Erik James Welsh, Bellaire, TX (US); Kevin Michael Troy, College Station, TX (US)

(73) Assignee: OCTAVO SYSTEMS LLC, Sugar Land, TX (US)

( * ) Notice: Subject to any disclaimer, the term of this patent is extended or adjusted under 35 U.S.C. 154(b) by 0 days.

(21) Appl. No.: 15/968,184

(22) Filed: May 1, 2018

(65) Prior Publication Data

US 2018/0317323 A1 Nov. 1, 2018

Related U.S. Application Data

(60) Provisional application No. 62/492,795, filed on May 1, 2017.

(51) Int. Cl.
| | |
|---|---|
| H05K 1/00 | (2006.01) |
| H05K 1/18 | (2006.01) |
| H05K 3/00 | (2006.01) |
| H05K 1/02 | (2006.01) |
| H05K 1/11 | (2006.01) |
| H01L 25/18 | (2006.01) |

(52) U.S. Cl.
CPC .......... *H05K 1/181* (2013.01); *H05K 1/0268* (2013.01); *H05K 1/111* (2013.01); *H05K 1/114* (2013.01); *H05K 1/119* (2013.01); *H05K 3/0005* (2013.01); *H01L 25/18* (2013.01); *H05K 2201/09227* (2013.01); *H05K 2201/09309* (2013.01); *H05K 2201/10151* (2013.01); *H05K 2201/10159* (2013.01); *H05K 2201/10704* (2013.01); *H05K 2201/10719* (2013.01); *H05K 2201/10734* (2013.01)

(58) Field of Classification Search
CPC ...... H05K 1/181; H05K 1/0268; H05K 1/114; H05K 1/119; H05K 3/0005; H05K 2201/10151; H05K 2201/10159; H05K 2201/10704; H05K 2201/10719; H05K 2201/10734; H01L 25/18
See application file for complete search history.

(56) References Cited

U.S. PATENT DOCUMENTS

| | | | |
|---|---|---|---|
| 4,667,403 | A | 5/1987 | Edinger |
| 5,396,403 | A | 3/1995 | Patel |

(Continued)

FOREIGN PATENT DOCUMENTS

| | | |
|---|---|---|
| EP | 1926138 A1 | 5/2008 |
| WO | 9852226 A1 | 11/1998 |
| WO | 2016025693 A1 | 2/2016 |

OTHER PUBLICATIONS

International Search Report and Written Opinion issued in Application No. PCT/US2015/045022, dated Nov. 4, 2015, 14 pages.

(Continued)

*Primary Examiner* — Pete T Lee
(74) *Attorney, Agent, or Firm* — Rothwell, Figg, Ernst & Manbeck, P.C.

(57) ABSTRACT

Systems and methods for the design and use of a System-in-Package (SiP) device with a connection layout for minimizing a system Printed Circuit Board (PCB) using the SiP are provided.

21 Claims, 7 Drawing Sheets

(56) References Cited

U.S. PATENT DOCUMENTS

| | | | |
|---|---|---|---|
| 5,683,788 A | | 11/1997 | Dugan |
| 5,696,029 A | | 12/1997 | Alvarez et al. |
| 6,133,626 A | | 10/2000 | Hawke |
| 6,268,238 B1 | | 7/2001 | Davidson |
| 7,060,535 B1 | | 6/2006 | Sirinorakul et al. |
| 8,065,576 B2 | | 11/2011 | Miner et al. |
| 8,378,466 B2 | * | 2/2013 | Chiu .................. H01L 21/568 |
| | | | 257/508 |
| 9,490,188 B2 | * | 11/2016 | Arvelo .................. H01L 23/34 |
| 2002/0017708 A1 | | 2/2002 | Takagi et al. |
| 2002/0052054 A1 | | 5/2002 | Akram |
| 2002/0170901 A1 | | 11/2002 | Lau |
| 2003/0110427 A1 | | 6/2003 | Rajsuman et al. |
| 2004/0229400 A1 | | 11/2004 | Chua |
| 2008/0029868 A1 | | 2/2008 | Lee |
| 2008/0288908 A1 | | 11/2008 | Hart et al. |
| 2008/0290486 A1 | | 11/2008 | Chen et al. |
| 2009/0278245 A1 | | 11/2009 | Bonifield et al. |
| 2010/0052135 A1 | | 3/2010 | Shim et al. |
| 2010/0134133 A1 | | 6/2010 | Pagani |
| 2011/0233753 A1 | | 9/2011 | Camacho et al. |
| 2012/0241984 A9 | * | 9/2012 | Pendse .................. H01L 24/03 |
| | | | 257/782 |
| 2013/0214386 A1 | | 8/2013 | Xie |
| 2013/0265726 A1 | * | 10/2013 | Murai .................. H05K 1/025 |
| | | | 361/748 |
| 2014/0117552 A1 | * | 5/2014 | Qian .................. H01L 23/5381 |
| | | | 257/762 |
| 2015/0130040 A1 | | 5/2015 | Defretin |
| 2017/0229409 A1 | * | 8/2017 | Hu .................. H01L 25/0657 |
| 2018/0374804 A1 | * | 12/2018 | Zhang .................. H01L 23/48 |

OTHER PUBLICATIONS

International Search Report and Written Opinion issued in Application No. PCT/US16/50157, dated Jan. 17, 2017, 24 pages.
International Search Report and Written Opinion issued in Application No. PCT/US17/015728, dated Jun. 6, 2017, 16 pages.
International Search Report and Written Opinion issued in Application No. PCT/US17/49611, dated Dec. 27, 2017, 17 pages.
International Search Report and Written Opinion issued in Application No. PCT/US17/052014, dated Dec. 4, 2017, 15 pages.
International Search Report and Written Opinion issued in Application No. PCT/US18/16171, dated Apr. 25, 2018, 12 pages.
C.R. Schlottmann, "Analog Signal Processing on a Reconfigurable Platform", Master's Thesis, School of Electrical and Computer Engineering, Georgia Institute of Technology, Aug. 2009, 72 pages.
J. McEleney, et al., "Multisite Test Strategy for SIP Mobile Technologies", Jul. 2006, 6 pages.
R. Normann, "First High-Temperature Electronics Products Survey 2005", Sandia Report, Apr. 2006, 44 pages.
S. Bernard, et al., "Testing System-In Package Wirelessly", IEEE, DTIS'06: Design and Test of Integrated Systems in Nanoscale Technology, Sep. 2006, Tunis (Tunisia), pp. 222-226, http://hal-lirmm.ccsd.cnrs.fr/lirmm-00094916, Sep. 15, 2006.
D. Appello, et al., "System-in-Package Testing: Problems and Solutions", IEEE, May-Jun. 2006, 4 pages.
Z. Noun, et al., "Wireless Approach for SIP and SOC Testing", Micro and nanotechnologies/Microelectronics, Université Montpellier II—Sciences et Techniques du Languedoc, 2010, English, https://tel.archives-ouvertes.fr/tel-00512832, Aug. 31, 2010, 66 pages.
P. O'Neill, "Choosing the Right Strategy for SIP Testing", EE Times, Connecting the Global Electronics Community, May 10, 2004, 2 pages.
M., Quirk, et al., "Semiconductor Manufacturing Technology", IC Fabrication Process Overview, Chapter 9, Oct. 2001, 41 pages.
J. Watson, et al., "High-Temperature Electronics Pose Design and Reliability Challenges", Analog Dialogue 46-04, Apr. 2012, 7 pages.
S. Benjaafar, et al., "Batch Sizing Models for Flexible Manufacturing Cells", Submitted to International Journal of Production Research, Department of Mechanical Engineering, University of Minnesota, 1995, 43 pages.
C. T. Sorenson, "Semiconductor Manufacturing Technology: Semiconductor Manufacturing Processes", NSF/SRC Engineering Research Center for Environmentally Benign Semiconductor Manufacturing, Arizona Board of Regents for the University of Arizona, 1999, 34 pages.
"Downhole Solutions", Motion Control Solutions Tailored to Your Critical Downhole Applications, What Moves Your World, MOOG, May 2013, 8 pages.
A. Weintraub, "Is Mass Customization the Future of Retail?", https://www.entrepreneur.com/article/229869, Nov. 14, 2013, 5 pages.
Hashimoto et al., "A System-in-Package (SiP) With Mounted Input Capacitors for Reduced Parasitic Inductances in a Voltage Regulator," 2010, IEEE, 25(3), pp. 731-740.
Office Action issued for U.S. Appl. No. 15/503,932 dated Jan. 5, 2018, 20 pages.
Final Office Action issued for U.S. Appl. No. 15/503,932 dated Aug. 2, 2018, 9 pages.

* cited by examiner

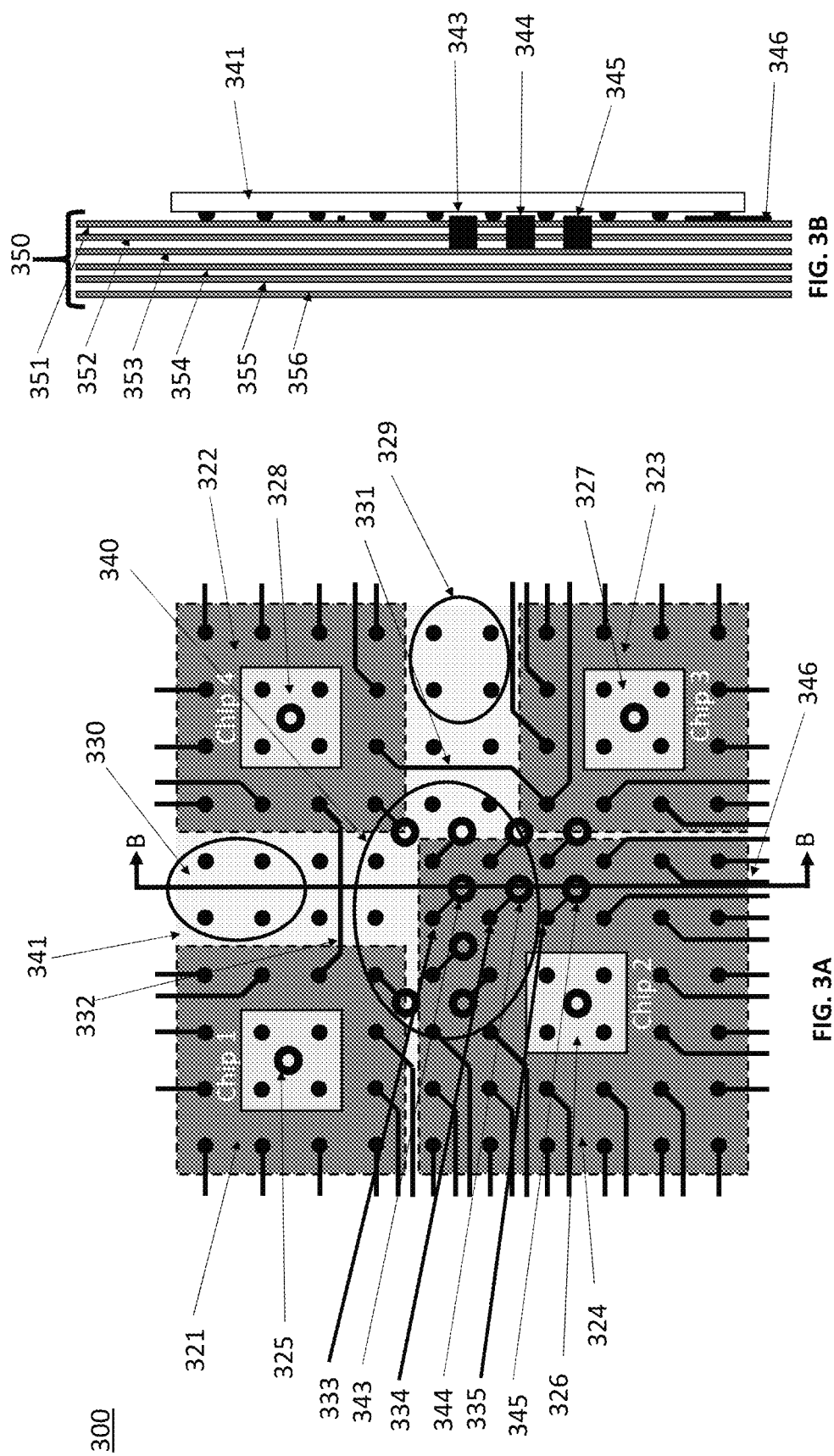

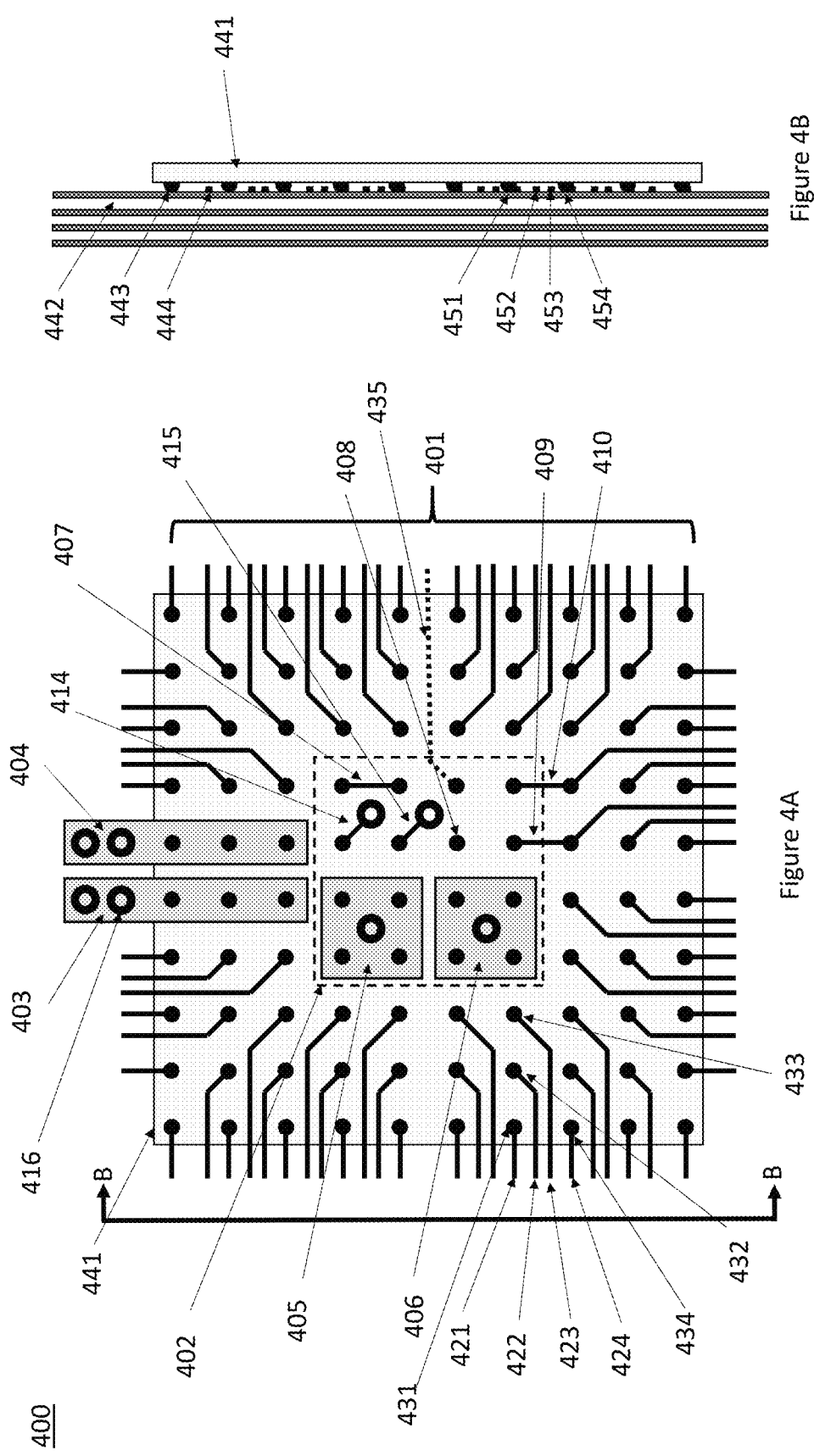

SYSTEM-IN-PACKAGE DEVICE BALL MAP AND LAYOUT OPTIMIZATION

CROSS REFERENCE TO RELATED APPLICATION

This application claims the benefit of U.S. Patent Application No. 62/492,795 filed on May 1, 2017, the disclosure of which is incorporated herein in its entirety by reference.

TECHNICAL FIELD

Disclosed are embodiments relating generally to a System-in-Package ("SiP") substrate and connection layout, and optimization of the same.

BACKGROUND

General purpose integrated circuits (ICs) are often designed without emphasis on optimizing the physical layout of the pins or balls on the package that will ultimately connect to other devices in a system design. There may be exceptions, for instance, when considering such combinations of circuits such as a processor and its memory, the power management for a system design, and in the analog domain of ICs, the relationship between digital, analog, and power pins with respect to potential noise issues. With the advent of System-in-Package (SiP) designs, there may be new complexities to the design for a SiP. In particular, a new complexity may arise in how to optimize a pin arrangement or ball map, for instance, of the SIP itself in order to optimize the layout of the PCB to which it is attached.

Accordingly, there is a need for systems and methods that optimize the substrate and connection layout in SiP designs.

SUMMARY

According to some embodiments, a system is provided. The system comprises, for example, a System-in-Package (SiP), wherein the SiP comprises an array of connectors on a bottom surface of the SiP, and a printed circuit board (PCB). In certain aspects, the PCB comprises a top layer, a ground layer, and a power layer, wherein the top layer comprises a plurality of escape traces on a top surface of the PCB. The PCB may include, for example, only 4 layers in some embodiments. The system may also comprise a plurality of electronic components mounted on the top surface of the PCB, wherein at least one of the plurality of electronic components is electrically connected to at least one of the plurality of escape traces. In certain aspects, the SiP is mounted on the top surface of the PCB and is arranged such that all external signals of the SiP are connected to the plurality of escape traces using the array of connectors. The connectors may be, for instance, one or more of an array of pins, an array of balls, and an array of contact surfaces, adapted for surface mount on the PCB. In some embodiments, the PCB has a bottom surface and no components are mounted on that bottom surface. Additionally, at least one of the connectors in the array of connectors may be a test point of the SiP and contact at least one of the ground layer and the power layer using a via of the PCB. In some embodiments, the electronic component electrically connected to the at least one escape trace is a digital processor, memory, graphics device, analog device, power management circuit, communications device, or sensor.

According to some embodiments, a SiP is provided. The SiP may be, for example, the SiP used in the system described above, and comprise: a SiP substrate, with an array of connectors on a bottom surface of the SiP substrate; a processor mounted on and electrically connected to the SiP substrate; a memory mounted on and electrically connected to the SiP substrate; and a plurality of SiP electronic components mounted on the SiP substrate and at least partially interconnected with one or more of the processor and the memory. In certain aspects, a first plurality of the connectors is configured for providing the external signals from at least one of the plurality of SiP electronic components to the plurality of electronic components mounted on the top surface of the PCB, a second plurality of the connectors is configured for providing power and ground connections for the SiP to the power layer and the ground layer of said PCB, respectively, and the first plurality of connectors is arranged along one or more outer edges of the array and the second plurality of connectors is arranged in a center of the array.

According to some embodiments, a System-in-Package (SiP) is provided. The SiP comprises, for example, a SiP substrate; a processor mounted on and electrically connected to the SiP substrate; a memory mounted on and electrically connected to the SiP substrate; a plurality of electronic components mounted on the SiP substrate and at least partially interconnected with one or more of the processor and the memory; and an array of connectors arranged on a bottom surface of the SIP package. In certain aspects, a first plurality of the connectors is configured for providing signals from at least one of said plurality of electronic components to an external device, and a second plurality of the connectors is configured for providing power and ground connections for the SiP. In some embodiments, the first plurality of connectors is arranged along one or more outer edges of the array and the second plurality of connectors is arranged in a center of the array. In some embodiments, the outer edge of the array is the outermost three rows and columns of connectors.

In some embodiments, the array of connectors is one or more of an array of pins, an array of balls, and an array of contact surfaces, adapted for surface mount on the PCB. Additionally, the electronic components may comprise one or more of a digital processor, memory, graphics device, analog device, power management circuit, communications device, and sensor.

According to some embodiments, a method for optimizing a system comprising a printed circuit board (PCB) and a System-in-Package (SiP) mounted on the PCB is provided. The method may include identifying signals generated by or used by components of the SiP, grouping signals of the identified SiP components that are internal signals of the SiP, and grouping signals of the identified SiP components that are external signals for the SiP. The method may also include identifying and grouping power input, power output, and ground lines for the SiP components. In some embodiments, the method also includes arranging the components and their connection to an array of package connectors of the SiP such that all of the external signals are connected to one or more escape traces on a top layer of said PCB and such that at least one of the power input, power output, and ground lines is connected to a via of the PCB through at least one of the package connectors, wherein the via is electrically connected to a power or ground layer of the PCB. The arranging may comprise, for example, determining the number and location of the package connectors, routing the external signals to one or more package connectors along one or more outer edges of the array, and routing one or more of the power input, power output, and ground lines to one or more package connectors in a center of the array.

One advantage of a SiP device is the potential opportunity to optimize the pin arrangement (or other connection set, such as a ball grid array) with respect to the system of which it may become a part. According to some embodiments, this is possible in either general purpose SiPs, which may be used in a variety of different system implementations, or in a specific system implementation where the pin arrangement of the SiP may be designed specifically for an optimal layout for a larger system.

These and other features of the present disclosure will become apparent to those skilled in the art from the following detailed description of the disclosure, taken together with the accompanying drawings.

BRIEF DESCRIPTION OF THE DRAWINGS

The accompanying drawings, which are incorporated herein and form part of the specification, illustrate various embodiments.

FIGS. 3A and 3B depict the traces of a PCB layout for a SiP device.

FIGS. 4A-4C depict the traces of PCB layout with optimized traces according to some embodiments.

DETAILED DESCRIPTION

Figure 1:
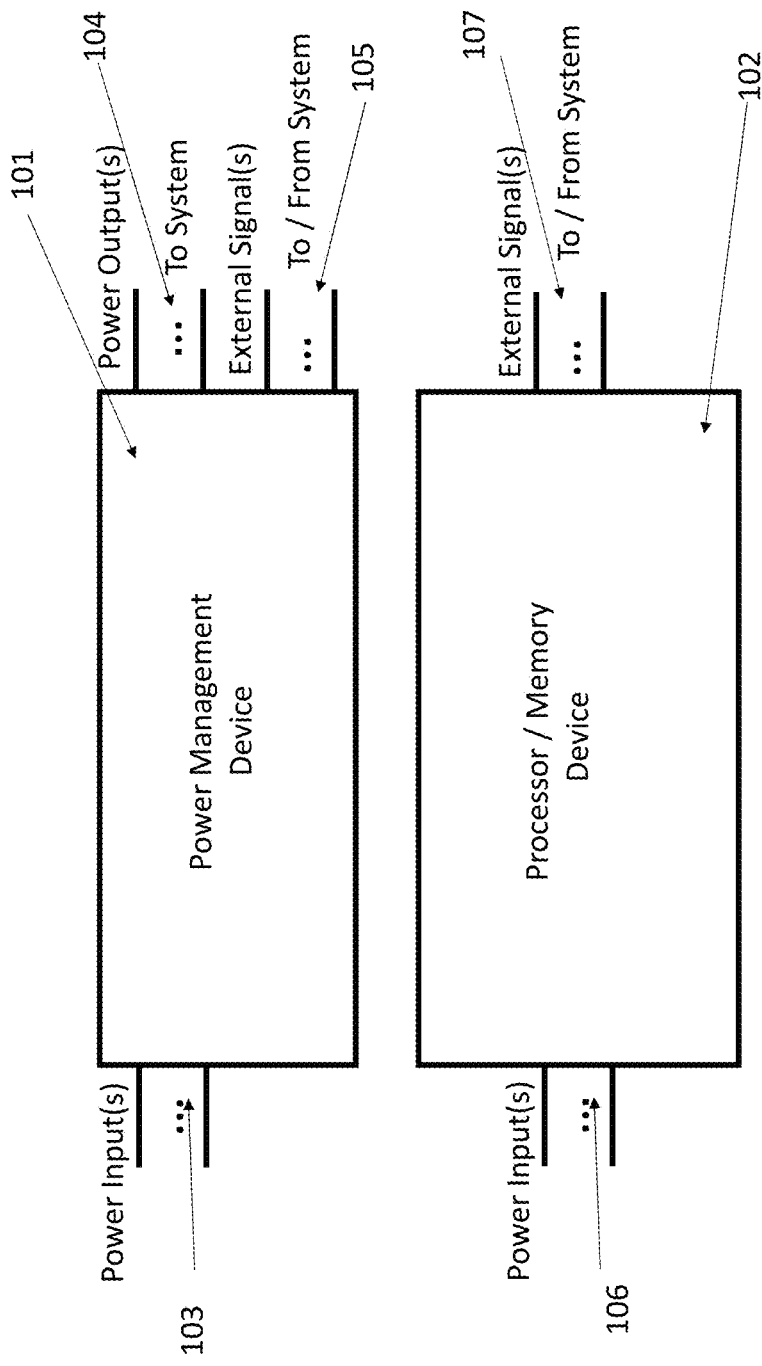
FIG. 1 is a diagram of a power management and a processor/memory device.

FIG. 1 depicts a simplified block diagram 100 of a power management device 101 and a processor/memory device 102 that may be a portion of system components mounted on a PCB. These two components, or their equivalents, may be used in FIG. 2 to illustrate the interconnections of these components in a SiP as opposed to a PCB. Continuing to refer to the example of FIG. 1, the power management device 101 uses three types of inputs/outputs: power inputs 103, power outputs 104 and external signals 105 that go to and from the system. In this example, processor/memory device 102 uses two types of inputs/outputs: power inputs 106 and external signals 107. The physical locations of inputs/outputs of each device 101, 102 in its package may be optimized specifically for that device and may be used in a typical PCB for a system.

Figure 2:
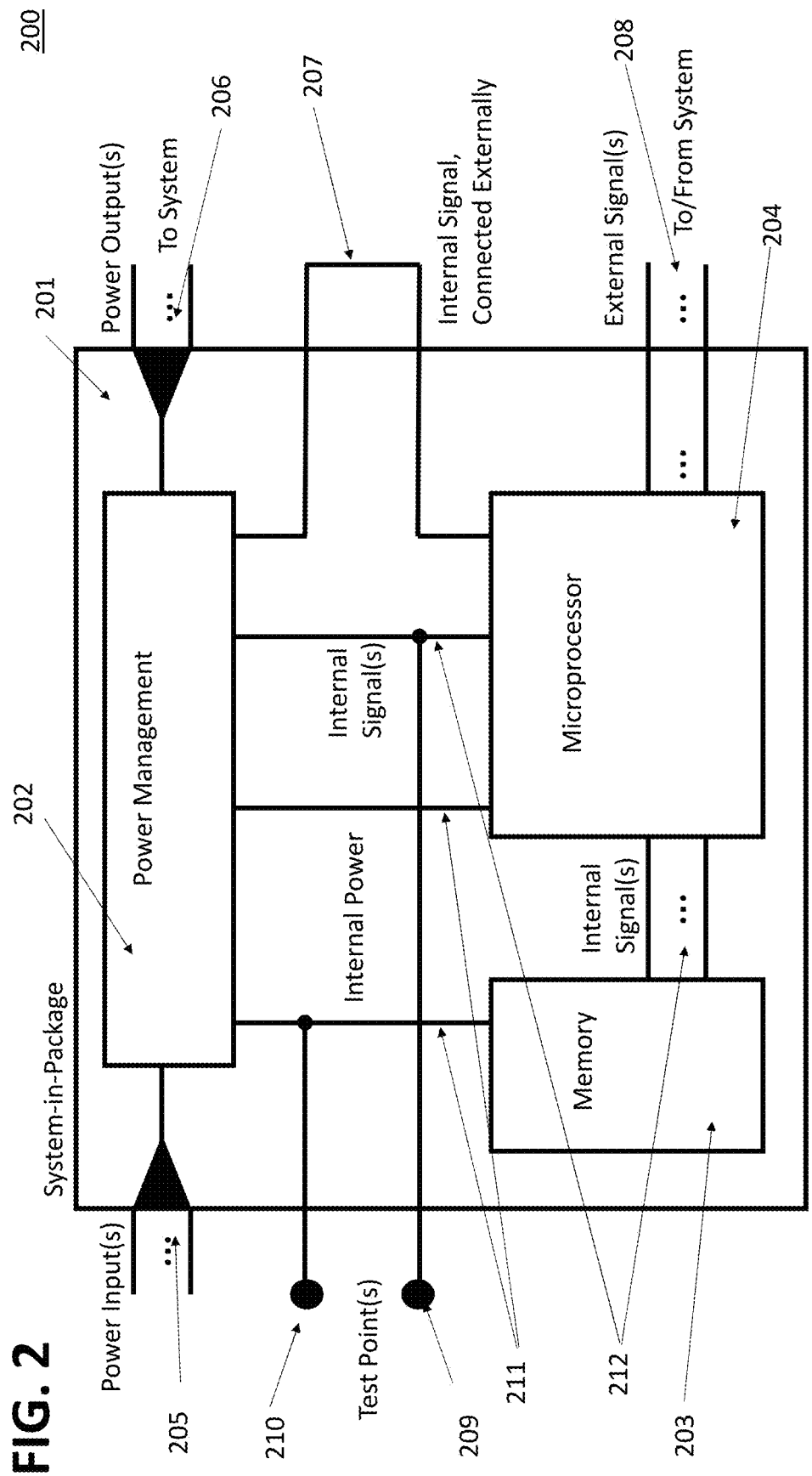
FIG. 2 is a diagram of a System-in-Package (SiP) device according to some embodiments.

FIG. 2 depicts a block diagram 200 of a System-in-Package (SiP) device 201 according to some embodiments. In certain aspects, the diagram 200 uses the components of FIG. 1. For instance, in this example, the SiP device 201 has three components: a power management device 202, a memory device 203, and a microprocessor 204. To connect these components within the SiP, there are a number of internal connections. These may include, for instance, internal power buses 211 and internal signal busses 212, which may be in the SiP substrate on which the three components are mounted. The SiP 201 also uses a number of inputs and outputs. In this example SiP 210, five types of inputs/outputs are used. These include power inputs and grounds 205, as well as power outputs 206. This SiP 201 also has external signals 208, which go, for instance, to and from the system to connect internal components/processing with external devices, such as a PCB and/or secondary system. Other inputs/outs may include test pins 209 and 210, which can be used to observe internal power buses or internal signals and signals that are brought off the SiP and then back on to it 207 so that those signals may be observed and/or used externally to the SiP. These selective internal signals may be connected externally 207 in order to allow individual control and testing of the components within the SiP by external components in a system.

FIG. 3A depicts the external connector or ball locations of a SiP substrate as black dots where the pinout for each of the four SiP components of this example (chips 1-4) are maintained instead of ball locations being optimized for use in a system PCB on which the SiP is to be mounted. The black lines attached to the black dots represent how signal traces on the surface layer of the PCB on which the SiP is to be mounted are connected to the balls of the SiP, and illustrate how those traces are used to get signals from the SiP balls out from under the SiP package to other components on the system's PCB. These lines or escape traces are only illustrated in a length to get the trace out from under the SiP package, as indicated by the outermost dashed line portions, but would be longer than depicted to connect to other components on the system's PCB. The larger black circles with a white dot in the center represent vias to other layers in the PCB.

Continuing to refer to FIG. 3A, it may be seen that the SiP 300 has four components 321, 322, 323, and 324 in this example. In this example, each component uses the same pinout (or ball map) it has as a standalone device for the SiP substrate, when it is integrated into the SiP. As may be seen in FIG. 3A, this results in multiple power inputs 325, 326, 327, and 328, and uses many more pins than is necessary to power the components integrated within the SiP. Internal signals that need to be connected externally 331 and 332 can result in traces that reduce the ability to route other signals on the same PCB layer. Unconnected pins 329 and 330 may be placed in areas that are more easily useable for PCB routing purposes. This can lead to numerous signals 333 that must use a via 343 to be routed to a different layer in the PCB. Once routed to this different layer in the PCB, that signal 333 may then be required to use another via to get back to the surface layer where all the components are located and attached both physically and electrically to the PCB to make the proper interconnections. For a component on the surface (or the bottom of the PCB), an interconnection may require the use of a via to get to the same layer in the PCB as signal 333 for proper interconnection.

The result of various signal balls of a SiP being connected to other components on the PCB using vias to other PCB layers can be an increase in the number of PCB layers. For example, six PCB layers may be required. Typically a PCB uses two or more layers for signal interconnections, two or three layers for power and ground distribution, and the top and bottom surface must be reserved for component attachment. With shared PCB surfaces, the number of required layers is typically six. However, and according to some embodiments, if all of the signal balls can escape from under the package on the top surface, layers can be removed from the PCB stack up (i.e., the layers that make up the PCB). For instance, in some embodiments, a PCB with no more than 4 layers is possible.

According to aspects of embodiments disclosed herein, and because of the often large size of a system PCB, it is more economical to have fewer PCB layers, even at the expense of more layers in the SiP substrate, if needed. The use of more layers on the SIP substrate allows for all of the complex signal connections to be made in the smaller size of the substrate and further allows for the external connections (e.g., a ball map) to be optimized for the external signals to escape from under the SiP package on the surface of a PCB on which the SiP and other components are mounted.

FIG. 3B depicts a cross-sectional view of FIG. 3A along B-B, where the packaged SiP device 341 is attached to the printed circuit board (PCB) 350 by soldering it down using all of the balls (pins). Specifically identified are vias 343, 344, 345, which are also shown in FIG. 3A, and which are connected to balls 333, 334, 335 for use on a signal or other plane in the PCB other than the top, first signal layer. Also illustrated is the electrical trace 346, which may also be seen in FIG. 3A. The PCB in this example has six layers 351-356. The external connections in the circle 340, which are in the middle of the layout cannot escape from under the package on the top surface, and therefore must be connected to a different layer in the PCB in order to be able to interconnect with other components on the PCB. In this illustration, balls 333, 334, and 335 are examples.

FIGS. 4A and 4B represent the same four components as in FIG. 3, but optimized for a system's PCB in accordance with some embodiments. For instance, FIG. 4 illustrate how the signals from components in a SiP may be connected and deployed on a single signal layer of the system PCB to which the SiP is attached. FIG. 4A depicts as black dots the external connector or ball locations of a SiP substrate from a top view looking through the package of the SiP 441, where the overall pinout for all components in the SiP have been optimized for use in a system on a system PCB using a minimum number of PCB layers. While balls are used in this illustration, according to embodiments, external connectors maybe be one or more of an array of pins, an array of balls, and an array of contact surfaces, adapted for surface mount on a PCB. In this example, the SiP substrate ball locations are the same locations as the balls on the system PCB. FIG. 4B depicts a side view of FIG. 4A at B-B, with 4 PCB layers depicted. In this embodiment, all of the external signals are contained in the three outer columns and rows. Examples of these three outer columns and rows are signal balls 431, 432 and 433. In certain aspects, the three rows and columns are a result of how many traces on the PCB surface can be routed between the connection balls located in the outermost rows and columns of SiP connection balls. In this example, the ball to ball spacing is 1.27 mm, which allow for two traces to be routed between connection balls.

Referring to FIG. 4A, the black lines attached to the black dots represent how signal traces on the top surface layer of the PCB on which the SiP is mounted are connected to the balls of the SiP, and illustrate how those traces are used to get signals from the SiP balls out from under the SiP package to other components on the system's PCB. These lines are escape traces and are only illustrated in a length sufficient to get the trace out from under the SiP package, where the package 441 (depicted as a shaded light gray area). These traces would be longer than depicted in order to connect to other components on the system's PCB. The larger black circles with a dot in the center represent vias to other layers in the PCB.

Continuing to refer to FIG. 4A, according to some embodiments, the outer three rows/columns of the ball grid array (BGA) 401 are routable on a single layer of the PCB 442. The connections inside dashed line box 402, however, are not routable on the same layer of the PCB where components are mounted. In this example the top layer of the PCB. To reduce the number of PCB layers, signals from the SiP device are brought out using escape traces on the surface of the PCB for the external signal balls such as 431, 432, and 433 which are placed in the outer three rows/columns of the SiP package.

Continuing to refer to the example of FIG. 4A, PCB traces 422 and 423 can be routed between SiP package pins 431 and 434 and their corresponding traces 421 and 424, thus bringing all four of the traces out on the top surface of the PCB. In this example, power inputs/outputs 403, 404, 405 and 406 are placed such that it is easy to group these pins together and connect to the underlying power planes of the PCB using vias, such as for example, but not limited to, via 416 as well as unlabeled vias inside blocks 405 and 406. Associated internal signals, connected externally 407 may be placed next to each other to allow for easy connection; internal signals that are needed for a common purpose, like for example, but not limited to, a communication port, may be grouped together. For a communication port, these types of signals may be, for example, but not limited to, address lines, control lines, data lines, and clock signals.

Continuing to refer to the example of FIG. 4A, in some embodiments, if an internal signal of one component must be connected to the signal of another component externally, like 407, it may be placed on connection balls that would not normally be routed on the PCB surface for mounting components, thus saving those connectors for external signals. Although, in some embodiments it is possible for two internal signals 409 and 410 that need to be connected together externally, to be brought out on the PCB surface on which components are mounted. In this case, one pin should be placed on a ball that would not be routable on a single layer and the other ball should be placed on a pad that would be routable on a single layer. Signals such as test points 414 and 415, may be connected using vias to another PCB layer such that they can easily connect to a test pad, if necessary. In some embodiments, the test points are placed in the balls that are not routable in a single layer unless there are unused signal ball connections available that are routable in the PCB layer for mounting components. Similarly, and according to some embodiments, unconnected pins 408 should be placed on pads that may not be routable in a single layer. This can reduce the overall number of PCB layers required to route the SiP signals.

According to some embodiments, and as illustrated in FIG. 4A, the three outermost rows/columns of pins/pads may be routed out from under the SiP package as the escape traces used to connect to other components on the system PCB. Additionally, dashed lead 435 depicts how an unconnected pin may still be brought out from under the SiP package for use with other components; in this manner, this disclosure illustrates how more escape traces or more leads than depicted for the three rows/columns of FIG. 4A may be utilized, if needed. For instance, the layout of FIG. 3 has only 2 such rows/columns that are usable. Escape trace 435 illustrates how balls or pins inside the outer rows/columns used for external signals may also be used to get other signals to the top layer of the PCB.

FIG. 4B depicts a side view of FIG. 4A at B-B, where the packaged SiP device 441 is attached to the printed circuit board (PCB) 442 by soldering it down using all of the balls (pins) such as 443, 451 and 454. PCB 442 is depicted with four layers. Specifically identified are balls 451 and 454 which are also shown in FIG. 4A as 431 and 434, respectively. Also illustrated are the electrical traces 452 and 453 (and also seen in FIG. 4A as 422 and 423, respectively) on the PCB 442, which are attached to balls 432 and 433, respectively. In these figures, for ease of depiction purposes, only a portion of the electrical traces or escape traces are shown in order to explain how the signals can be brought out from under the package to form the rest of the system's circuit on the system's PCB.

Figure 4C:
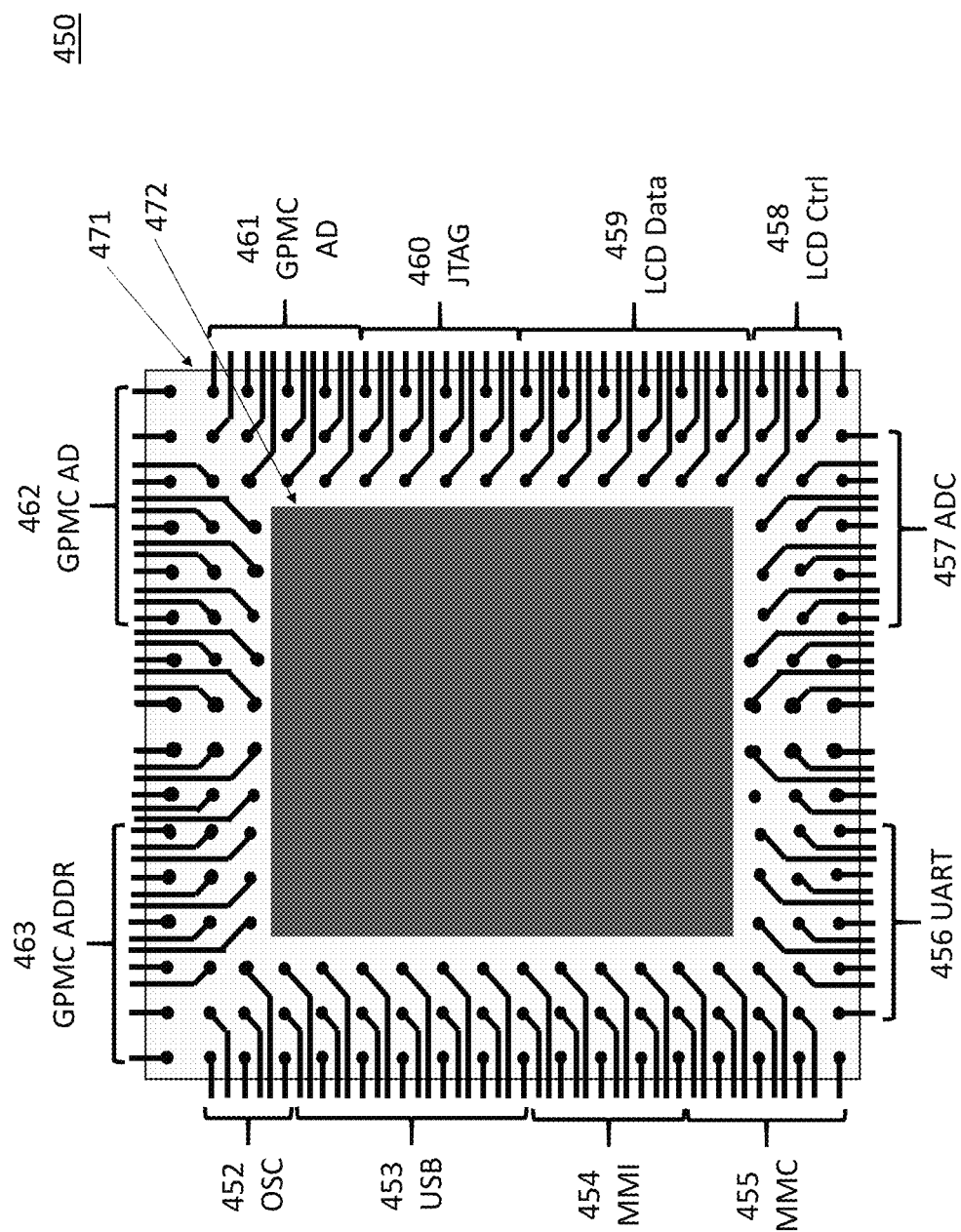

Referring now to FIG. 4C, and according to some embodiments, grouping of the PCB layout traces 450 is used to allow the signals from the SiP to escape from under the SiP package 471 on one layer of the PCB. In this illustration, the connection balls in the middle of the SiP have been blacked out 472 as they are the power and ground external connections for the SiP. In this depiction there are several groups of signals identified which are typical, but not limited to, a microprocessor system. These escape traces allow the signals to escape out from under the SiP package to other components on the PCB board or substrate. In this example, the signal groups shown are the oscillator 452, USB 453, MMI 454, MMC 455, UART/SPI/I2C 456, Analog to Digital Converter 457, LCD Control 458 and LCD Data 459, JTAG 460, GPMC address and data 463, 461 and 462 respectively.

Figure 5:
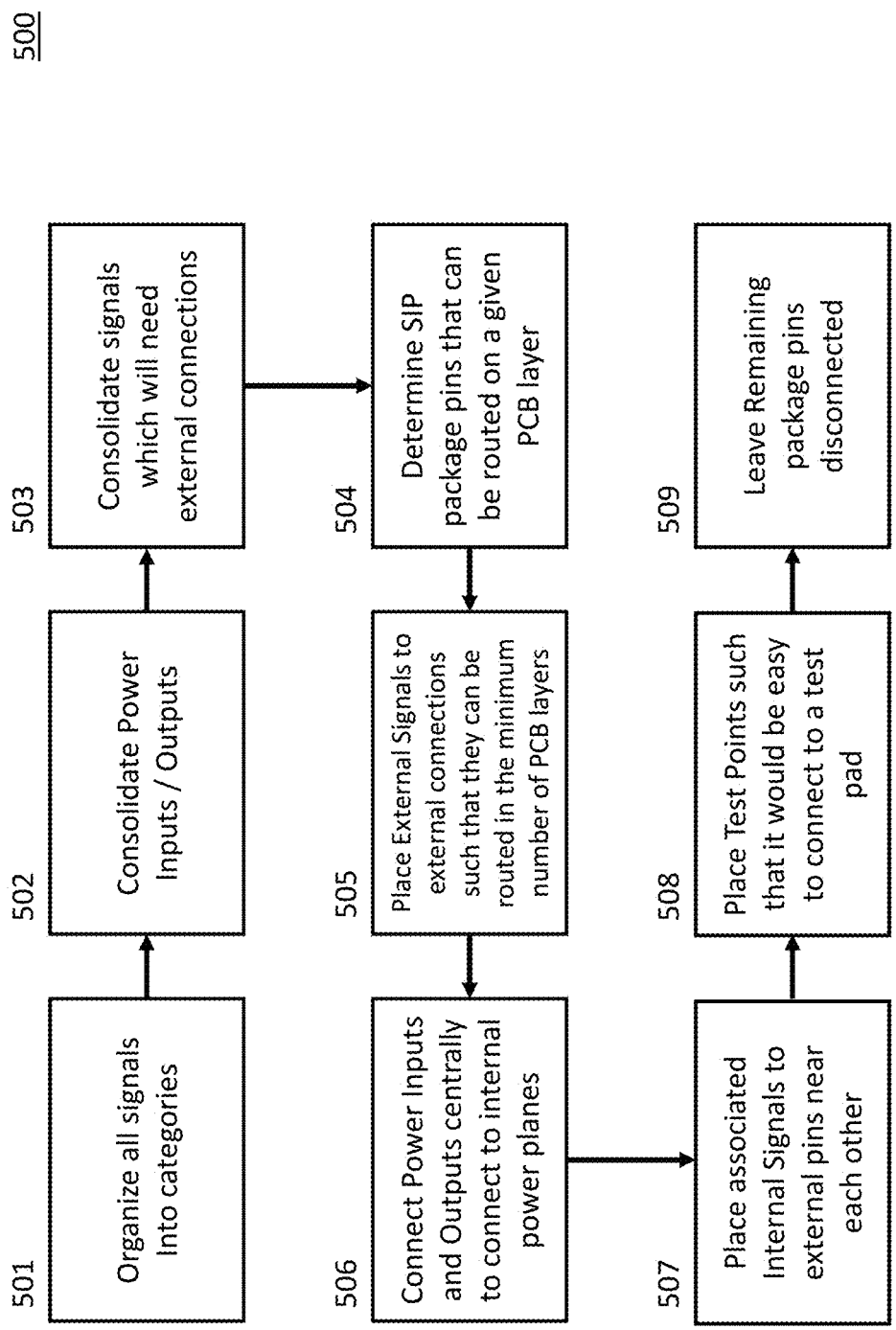
FIG. 5 is a flow chart of a process for the optimal placement of connectors in a SiP according to some embodiments.

FIG. 5 depicts a process 500 according to some embodiments. This process may be used to determine the optimal placement of connectors in a SiP substrate for minimizing the number of layers in a system PCB using that SiP. According to some embodiments, first, all pins or signals of all the components in the SiP are classified into different categories in step 501. These may include, for example, power and ground inputs, power outputs, internal power connections (e.g. those used only internally), internal signals used only internally, internal signals connected externally, external signals, and test points (required for monitoring internal signals and/or internal power connections). The data sheets for the components used in the SiP may be consulted to determine what signals are needed for each component in the SiP and their respective classification or category. Additionally, the data sheet for the SiP may be consulted to determine which, if any, components in the SiP are only used for internal interconnections with the other components in the SiP and have no requirement for external connections.

In step 502, power inputs, grounds and power outputs are consolidated in one category by voltage and power domains to determine the number of package pins needed for each power input, ground or power output. In certain aspects, the initial number of external connectors needed for power and ground may be reduced by consolidating some of the same voltages and grounds to a single external connector by voltage value and by ground, depending upon maximum current demands for that external connection and the maximum internal currents for the interconnections between that external connector and the internal or external devices/components being supplied by that external connector.

In some embodiments, the category for internal signals that are used only internally and internal power connections that do not require monitoring test points, as well as any other signals that do not need to be connected to external pins (or balls) may be eliminated from consideration, because they have no need for any external connection.

According to some embodiments, the process may move to step 503 for consolidating the set of signals that require external connectors, or package pins (or balls) for use in the system and accordingly connections to the system PCB. Next, and according to some embodiments, how many pins are available for use in the SiP package must be determined 504, and accordingly the corresponding connecting locations on the system PCB. That is, determining the number of package pins that can be routed on a given PCB layer for a given PCB technology node 504 can be based on the package used for the SiP.

For example, but not limited to, using 1.27 mm pitch BGA pins and a 6 mil PCB trace with 6 mil tolerance between traces, this results in the outer three rows/columns of the BGA being able to be routed on a single layer of the PCB substrate. According to some embodiments, any pins inside the outer three rows/columns of the BGA cannot be routed on a single PCB layer, if needed externally. In certain aspects, once the numbers, spacing and size of pins for a package have been determined for a given PCB in step 504, then placement of the minimal set of signals determined through step 503 can begin.

According to some embodiments, first, the external signals can be placed on package connection balls such that they can be routed in the fewest number of PCB layers 505. Second, the power inputs, grounds and power outputs should be centrally placed 506 such that it is easy to connect to power and ground planes. Then, associated internal signals connected externally should be placed next to each other 507. Next, test points should be placed 508 such that it is easy to connect to a test pad. Finally, any remaining pins are left unconnected 509. FIG. 4A depicts one such connector placement that may result from the steps of FIG. 5. Using the methods of the present disclosure can allow for a reduced number of layers in a system PCB using a SiP device, thereby reducing the system PCB costs, as well as eliminating the need to place components on the bottom or underside of the system PCB because of these optimum interconnections.

Figure 6:
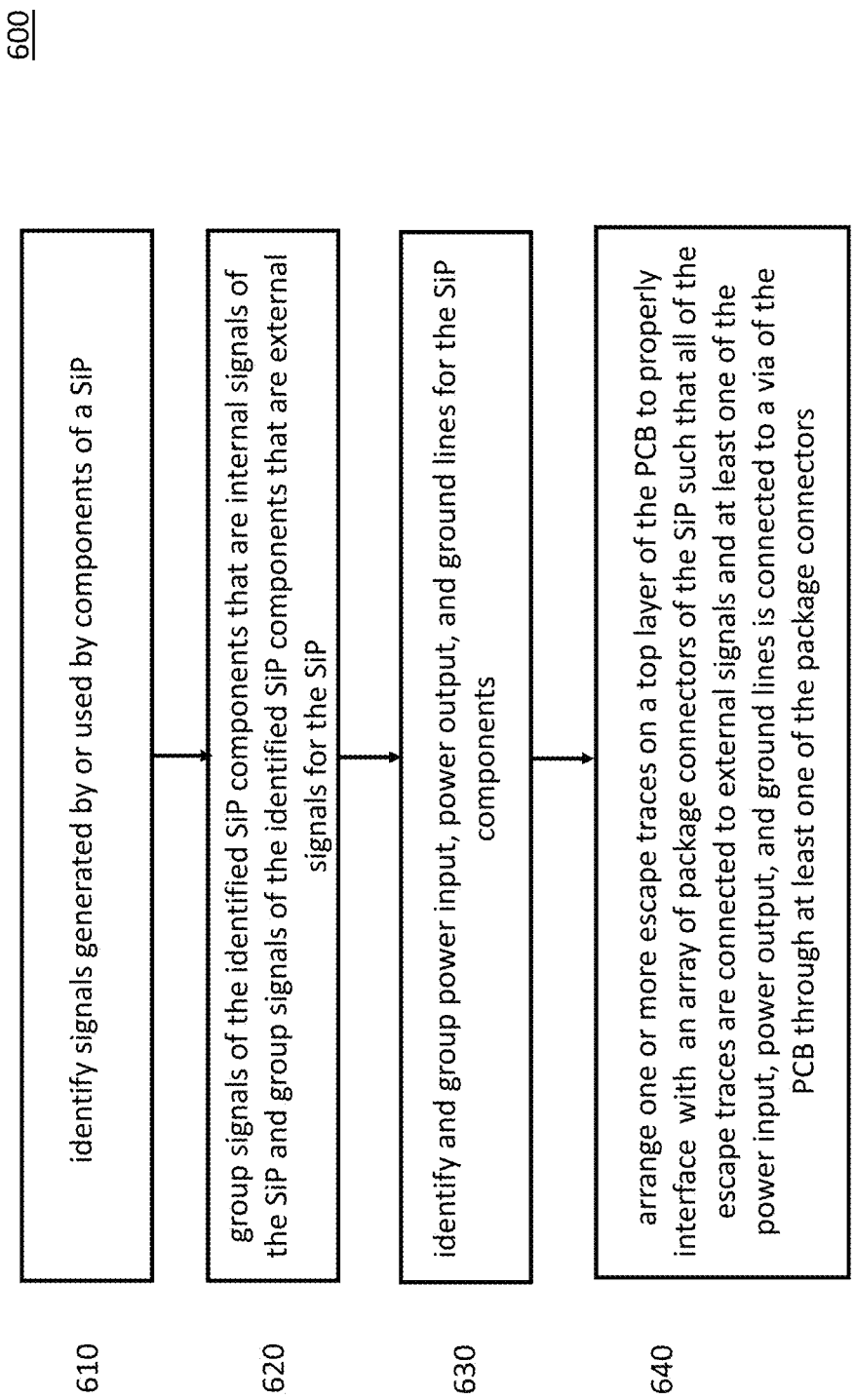
FIG. 6 is a flow chart of a process for the optimal placement of connectors in a SiP according to some embodiments.

Referring now to FIG. 6, a process 600 for optimizing a system comprising a printed circuit board (PCB) and a System-in-Package (SiP) mounted on the PCB according to some embodiments is provided.

In step 610, signals generated by or used by components of the SiP are identified.

In step 620, signals of the identified SiP components that are internal signals of the SiP are grouped, and signals of the identified SiP components that are external signals for the SiP are grouped.

In step 630, power input, power output, and ground lines for the SiP components are identified and grouped.

In step 640, the components and their connections to an array of package connectors of the SiP, such as pins or balls, are arranged such that all of the external signals are connected to one or more escape traces on a top layer of a PCB. In some embodiments, one or more escape traces on a top layer of a PCB are arranged to properly interface with an array of package connectors of the SiP, such that all of the escape traces are connected to external signals and such that at least one of the power input, power output, and ground lines is connected to a via of the PCB through at least one of the package connectors. In some embodiments, that via is electrically connected to a power or ground layer of said PCB.

While the processes described above and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel.

While various embodiments of the present disclosure are described herein, it should be understood that they have been presented by way of example only, and not limitation. Thus, the breadth and scope of the present disclosure should not be limited by any of the above-described exemplary embodi-

What is claimed is:

1. A system, comprising:
   a System-in-Package (SiP) including a SiP substrate, a plurality of SiP electronic components within the SiP, a plurality of internal electrical connections for connecting between said plurality of SiP electronic components, and an array of connectors formed on a bottom surface of said SiP substrate;
   a printed circuit board (PCB), wherein said PCB comprises a top layer, a ground layer, and a power layer, wherein said top layer comprises a plurality of escape traces on a top surface of said PCB, and wherein said SiP is mounted on said top surface of said PCB; and
   a plurality of electronic components mounted on said top surface of said PCB,
   wherein at least one of said plurality of electronic components is electrically connected to at least one of said plurality of escape traces, and
   wherein at least one of said plurality of SiP electronic components is electrically connected to at least one of said plurality of escape traces using said array of connectors.

2. The system of claim 1, wherein said PCB consists of 4 layers.

3. The system of claim 1, wherein said PCB has a bottom surface and no components are mounted on said bottom surface.

4. The system of claim 1, wherein at least one of said array of connectors is a test point of said SiP and contacts at least one of said ground layer and said power layer using a via of said PCB.

5. The system of claim 1, wherein said array of connectors is one or more of an array of pins, an array of balls, and an array of contact surfaces, adapted for surface mount on said PCB.

6. The system of claim 1, wherein said at least one of said plurality of electronic components electrically connected to said at least one of said plurality of escape traces is one or more of a digital processor, a memory, a graphics device, an analog device, a power management circuit, a communications device, or a sensor.

7. The system of claim 1, wherein said SiP comprises:
   a processor mounted on a top surface of said SiP substrate, wherein the processor is operatively interconnected with said SiP substrate; and
   a memory mounted on the top surface of said SiP substrate, wherein the memory is operatively interconnected with said SiP substrate, wherein
   said plurality of SiP electronic components at least partially interconnected with one or more of said processor and said memory,
   a first group of said array of connectors is for providing signals from at least one of said plurality of SiP electronic components to at least one of said plurality of electronic components mounted on said top surface of said PCB,
   a second group of said array of connectors is for providing power and ground connections for said SiP to said power layer and said ground layer of said PCB, respectively, and
   said first group of said array of connectors is arranged along one or more outer edges of said array of connectors and said second group of said array of connectors is arranged in a center portion of said array of connectors.

8. A System-in-Package (SiP), comprising:
   a SiP substrate;
   a processor mounted on a top surface of said SiP substrate, wherein the processor is operatively interconnected with said SiP substrate;
   a memory mounted on the top surface of said SiP substrate, wherein the memory is operatively interconnected with said SiP substrate;
   a plurality of SiP electronic components within the SiP, wherein said plurality of SiP electronic components is at least partially interconnected with one or more of said processor and said memory;
   a plurality of internal electrical connections for connecting between said plurality of SiP electronic components; and
   an array of connectors arranged on a bottom surface of said SIP substrate, wherein
   a first group of said array of connectors is for providing signals from at least one of said plurality of SiP electronic components to a component outside of the SiP,
   a second group of said array of connectors is for providing power and ground connections for said SiP, and
   said first group of said array of connectors is arranged along one or more outer edges of said array of connectors and said second group of said array of connectors is arranged in a center portion of said array of connectors.

9. The SiP of claim 8, wherein said array of connectors is one or more of an array of pins, an array of balls, and an array of contact surfaces, adapted for surface mount on said PCB.

10. The SiP of claim 8, wherein said electronic components comprise one or more of a digital processor, memory, graphics device, analog device, power management circuit, communications device, and sensor.

11. A method for optimizing a system comprising a printed circuit board (PCB) and a System-in-Package (SiP) mounted on said PCB, comprising:
   identifying signals generated by or used by SiP electronic components included in said SiP;
   among the identified signals, grouping internal signals of said SiP electronic components that are for use inside said SiP;
   among the identified signals, grouping external signals of said SiP electronic components that are for use outside of said SiP;
   identifying and grouping power input, power output, and ground lines for said SiP electronic components;
   arranging a first group of an array of connectors on a bottom surface of the SiP, wherein the first group of the array of connectors is configured to be used for the grouped external signals;
   arranging a second group of the array of connectors on the bottom surface of the SiP, wherein the second group of the array of connectors is configured to be used for the grouped power input, power output, and ground lines; and
   arranging one or more escape traces on a top layer of said PCB to properly interface with the first group of the array of connectors, wherein
   said one or more escape traces is configured to be used for at least one of the external signals, at least one of said power input, said power output, and said ground lines is connected to a via of said PCB through at least one of said array of connectors, and said via is electrically connected to a power or ground layer of said PCB.

12. The method of claim 11, wherein said arranging comprises determining the number and location of said package connectors.

13. The method of claim 11, wherein said arranging comprises:

routing said external signals to one or more package connectors along one or more outer edges of said array; and routing one or more of said power input, power output, and ground lines to one or more package connectors in a center of said array.

14. The system of claim 1, wherein said plurality of SiP electronic components is interconnected using internal signals that are not delivered through said array of connectors.

15. The system of claim 1, wherein said plurality of SiP electronic components is electrically connected to at least one of said plurality of electronic components using said array of connectors.

16. The system of claim 1, wherein at least one of said array of connectors is for returning a signal to at least one of said plurality of electronic components of said SiP.

17. The system of claim 14, wherein said internal signals comprise power and ground signals.

18. The SiP of claim 8, wherein said SiP substrate contains a plurality of conductive layers for electrically connecting said plurality of electronic components, said processor, and said memory using internal signals that are not transmitted through said array of connectors.

19. The system of claim 1, wherein said plurality of SiP electronic components includes a first SiP electronic component and a second SiP electronic component, one or more power inputs and/or one or more power outputs of the first SiP electronic component and one or more power inputs and/or one or more power outputs of the second SiP electronic component are arranged such that said one or more power inputs and/or said one or more power outputs of the first SiP electronic component and said one or more power inputs and/or said one or more power outputs of the second SiP electronic components occupy a first area of said SiP, signal connectors associated with the first SiP electronic component and signal connectors associated with the second SiP electronic component occupy a second area of said SiP which is different from the first area of the said SiP, and the second area of said SiP surrounds the first area of said SiP.

20. The SiP of claim 8, wherein said plurality of SiP electronic components includes a first SiP electronic component and a second SiP electronic component, one or more power inputs and/or one or more power outputs of the first SiP electronic component and one or more power inputs and/or one or more power outputs of the second SiP electronic component are arranged such that said one or more power inputs and/or said one or more power outputs of the first SiP electronic component and said one or more power inputs and/or said one or more power outputs of the second SiP electronic components occupy a first area of said SiP, signal connectors associated with the first SiP electronic component and signal connectors associated with the second SiP electronic component occupy a second area of said SiP which is different from the first area of the said SiP, the second area of said SiP surrounds the first area of said SiP, said one or more power inputs and/or said one or more power outputs of the first SiP electronic component and said one or more power inputs and/or said one or more power outputs of the second SiP electronic component correspond to said second group of said array of connectors, and the signal connectors associated with the first SiP electronic component and the signal connectors associated with the second SiP electronic component correspond to said first group of said array of connectors.

21. The method of claim 11, wherein said plurality of SiP electronic components includes a first SiP electronic component and a second SiP electronic component, one or more power inputs and/or one or more power outputs of the first SiP electronic component and one or more power inputs and/or one or more power outputs of the second SiP electronic component are arranged such that said one or more power inputs and/or said one or more power outputs of the first SiP electronic component and said one or more power inputs and/or said one or more power outputs of the second SiP electronic components occupy a first area of said SiP, signal connectors associated with the first SiP electronic component and signal connectors associated with the second SiP electronic component occupy a second area of said SiP which is different from the first area of the said SiP, the second area of said SiP surrounds the first area of said SiP, said one or more power inputs and/or said one or more power outputs of the first SiP electronic component and said one or more power inputs and/or said one or more power outputs of the second SiP electronic component correspond to said second group of said array of connectors, and the signal connectors associated with the first SiP electronic component and the signal connectors associated with the second SiP electronic component correspond to said first group of said array of connectors.

* * * * *